US012588526B2

(12) United States Patent
Sinclair et al.

(10) Patent No.: US 12,588,526 B2
(45) Date of Patent: Mar. 24, 2026

(54) ION MICROTRAP ASSEMBLY AND METHOD OF MAKING OF MAKING SUCH AN ASSEMBLY

(71) Applicant: NPL MANAGEMENT LIMITED, Teddington (GB)

(72) Inventors: Alastair Sinclair, Teddington (GB); Guido Wilpers, Teddington (GB); Kaushal Choonee, Teddington (GB); Garrie Vickers, Livingston (GB); Bill Ashby, Livingston (GB)

(73) Assignee: NPL MANAGEMENT LIMITED, Teddington (GB)

( * ) Notice: Subject to any disclaimer, the term of this patent is extended or adjusted under 35 U.S.C. 154(b) by 282 days.

(21) Appl. No.: 18/033,976

(22) PCT Filed: Oct. 29, 2021

(86) PCT No.: PCT/GB2021/052811
§ 371 (c)(1),
(2) Date: Apr. 26, 2023

(87) PCT Pub. No.: WO2022/090731
PCT Pub. Date: May 5, 2022

(65) Prior Publication Data
US 2023/0402362 A1 Dec. 14, 2023

(30) Foreign Application Priority Data
Oct. 30, 2020 (GB) ...................................... 2017249

(51) Int. Cl.
H01L 23/498 (2006.01)
H01L 21/48 (2006.01)
H01L 23/00 (2006.01)

(52) U.S. Cl.
CPC .... H01L 23/49838 (2013.01); H01L 21/4846 (2013.01); H01L 23/49816 (2013.01);
(Continued)

(58) Field of Classification Search
CPC ... H01L 23/13; H01L 23/49838; H01L 23/15; G06N 10/40; G21K 1/00
See application file for complete search history.

(56) References Cited

U.S. PATENT DOCUMENTS 4,437,141 A * 3/1984 Prokop ............... H01L 23/5385
257/E23.067
2003/0015786 A1 * 1/2003 Yamamura ........ H01L 23/49838
257/691
(Continued)

FOREIGN PATENT DOCUMENTS

EP 0074816 A2 3/1983
EP 1720203 A2 11/2006
(Continued)

OTHER PUBLICATIONS

International Search Report and Written Opinion for PCT Application No. PCT/GB2021/052811, dated Jan. 24, 2022, 13 pages.
(Continued)

*Primary Examiner* — Moazzam Hossain
(74) *Attorney, Agent, or Firm* — Dickinson Wright PLLC

(57) ABSTRACT

An ion-trap chip carrier (10) comprises a generally planar carrier substrate, the substrate having a front surface, a rear surface, and a chip receptacle. A chip support (22) is disposed in the chip receptacle of the carrier substrate, the chip support including at least one generally planar flange (22) extending in or generally parallel to a plane of the carrier substrate, and at least one aperture therein. The chip support comprises a chip receiving zone. The at least one chip support includes at least one front facing electrical
(Continued)

terminal (15, 17) in the chip receiving zone, for coupling to a rear facing terminal of an ion-trap chip (50). At least one front facing wire bonding terminal (80, 82) is electrically coupled to the at least one front facing electrical terminal (15, 17), the at least one front facing wire bonding terminal being disposed outside of the chip receiving zone. A chip (50) is fitted to the carrier (10) in the chip receiving zone with its rear facing electrical terminals in alignment with the front facing electrical terminals (15, 17) in the chip receiving zone and electrically connected through the at least one front facing wire bonding terminal, to be wire bonded from the front face of the carrier (10). Gold bump studs or pads (60) connect the rear facing chip terminals with the front facing carrier terminals (15, 17) and provide both mechanical and electrical connection between the two.

18 Claims, 12 Drawing Sheets

(52) U.S. Cl.
    CPC ........ *H01L 23/49827* (2013.01); *H01L 24/16* (2013.01); *H01L 24/81* (2013.01); *H01L 2224/16225* (2013.01); *H01L 2224/81201* (2013.01)

(56)                   References Cited

U.S. PATENT DOCUMENTS

| | | | | |
|---|---|---|---|---|
| 2006/0169882 | A1* | 8/2006 | Pau | H01J 49/0018 |
| | | | | 428/161 |
| 2007/0040113 | A1* | 2/2007 | Monroe | G04F 5/14 |
| | | | | 250/288 |
| 2009/0101396 | A1* | 4/2009 | Mizuno | H01L 23/552 |
| | | | | 174/260 |
| 2009/0115072 | A1* | 5/2009 | Rhyner | H01L 21/4853 |
| | | | | 257/E23.141 |
| 2011/0317392 | A1 | 12/2011 | Han et al. | |
| 2012/0319288 | A1* | 12/2012 | Birge | H01L 23/49838 |
| | | | | 257/773 |
| 2015/0016074 | A1* | 1/2015 | Tsujino | H01L 23/057 |
| | | | | 361/752 |
| 2019/0027355 | A1* | 1/2019 | Kim | H01J 49/16 |

FOREIGN PATENT DOCUMENTS

| | | | |
|---|---|---|---|
| EP | 2221867 | A1 | 8/2010 |
| EP | 2535926 | A2 | 12/2012 |

OTHER PUBLICATIONS

Wilpers et al., "A compact UHV package for microfabricated ion-trap arrays with direct electronic air-side access," Applied Physics B: Lasers and Optics, 2013, pp. 1-8.

KYOCERA Corporation, "Manufacturing Process: Ceramic Multilayer Packages," https://global.kyocera.com/prdct/semicon/about_ceramic_package/detail/multi_pkg.html, Oct. 3, 2025, pp. 1-6.

\* cited by examiner (a)

trap chip

AlN substrate chip carrier
laser cut (c)

(b)

Ø = 75µm
height ≥ 50µm

~50% Au bump compression
Typical process = 40% ~ 55% range

ION MICROTRAP ASSEMBLY AND METHOD OF MAKING OF MAKING SUCH AN ASSEMBLY

CROSS-REFERENCE TO RELATED APPLICATION(S)

The present application is a U.S. national phase application of International Patent Application No. PCT/GB2021/052811, filed on Oct. 29, 2021, which claims priority to Great Britain Patent Application No. 2017249.0 filed on Oct. 30, 2020, the disclosures of which are hereby incorporated by reference in their entireties.

TECHNICAL FIELD

The present invention relates to an ion microtrap assembly, to components therefor and to a method of manufacturing such an assembly.

BACKGROUND TO THE INVENTION

Ion microtraps are of significant interest for their applicability to quantum technologies such as information processing and metrology. They are expected to be a key component for high-performance quantum computers of the future. These computers, which will contain many quantum bits (or "qubits"), will be able to solve problems that are intractable today.

More specifically, micro-fabricated ion traps (microtraps) offer a method of trapping single ions or strings of ions to create devices for quantum computing, sensing, precision metrology, scientific investigations, quantum communications and networking. As these traps are based on atoms, they have advantages over solid state circuit designs in that reliable and identical traps can potentially be manufactured, enabling scaling up for use in real systems.

Several types of microtraps are currently known and these are usually classified by their electrode geometry as 2D and 3D traps. The performance of microtraps in general increases with the dimensional aspect. However, due to restrictions in availability, many researchers work with 2D traps. Only the 3D trap geometry has the necessary performance in terms of superior heating rate and lower errors suitable for scaling up to industrial systems. In particular, the applicant believes 3D electrode geometry can offer superior operating characteristics and can achieve low noise (motional decoherence) operation at room temperature, beyond that achieved by other devices at room temperature. In quantum gates lower errors are expected from the low measured heating rate.

Testing and characterisation of such ion traps is performed under ultra-high-vacuum (UHV) conditions using apparatus that provides a combination of good optical access and multiple electrical feedthroughs for DC signals and high voltage RF. Most known approaches use standard and usually bulky UHV feedthroughs requiring considerable in-vacuum cabling and electronic filtering to be close to the trap electrodes. A widely used example adds a custom-made socket device enabling the use of ion traps packaged in pin grid array (PGA) carriers. This facilitates quick replacement of chips inside the vacuum.

All these approaches present limitations to properties desirable for ion-trap characterisation and operation, in particular: (1) low-loss transmission of high-voltage RF signals, (2) transmission of low-noise DC voltages, (3) fast DC switching speeds, (4) efficient filtering of RF pick-up, and (5) flexibility of the electronic setup. An example for the need for flexibility is the difference between the electronic filtering for the measurement of anomalous heating rates and for the fast and controlled shuttling of ions.

SUMMARY OF THE PRESENT INVENTION

The present invention seeks to provide an improved ion-trap chip carrier, an improved ion-trap assembly and an improved method of fabricating an ion trap.

According to an aspect of the present invention, there is provided an ion-trap chip carrier comprising:

- a generally planar carrier substrate, the substrate having a front surface, a rear surface, and a chip receptacle;
- a chip support disposed in the chip receptacle of the carrier substrate, the chip support including at least one generally planar flange extending in or generally parallel to a plane of the carrier substrate, and at least one aperture therein, the chip support comprising a chip receiving zone;
- the at least one chip support including at least one front facing electrical terminal in the chip receiving zone, for coupling to a rear facing terminal of an ion-trap chip;
- and at least one front facing wire bonding terminal electrically coupled to the at least one front facing electrical terminal, the at least one front facing wire bonding terminal being disposed outside of the chip receiving zone;
- whereby a chip can be fitted to the carrier in the chip receiving zone with a rear facing electrical terminal in alignment with the least one front facing electrical terminal in the chip receiving zone and electrically connected through the at least one front facing wire bonding terminal, to be wire bonded from the front face of the carrier.

In practice, the carrier can support an ion-trap chip directly thereon, through an attachment, without the need for an intermediate component such as an aluminium nitride substrate as known in the art. Additionally, the design of the carrier enables wire bonding and direct connections such as to multi-pin connectors from the front side of the assembly of the rear terminals of a double-sided ion-trap chip, considerably facilitating the assembly process. Furthermore, the carrier structure enables much more precise alignment of the chip on the carrier, improving reliability and scalability of manufacture.

Advantageously, the chip support comprises first and second opposing generally planar flanges facing one another between said at least one aperture. The chip support preferably comprises a third generally planar flanges disposed between the first and second generally planar flanges. The flanges provide a good support for the chip as well as locations for front-facing terminals for coupling to the rear terminals of an ion-trap chip.

The at least one aperture is or comprises an aperture at a centre-point of the carrier.

Preferably, the chip receiving zone is recessed relative to a front surface of the carrier. This provides the advantage of recessing the attachment mechanism and at least a part of the chip, which improves the strength of the assembly.

In an embodiment, the chip support has a lower surface formed of the flange or flanges that is generally in the same plane as the rear surface of the carrier.

Advantageously, the or at least one of the generally planar flanges comprises an array of electrical terminals. In practice, the front facing terminals on the flanges will be arranged and numbered to match the rear facing terminals of an ion-trap chip, such that preferably all of the operative rear facing terminals of the ion-trap chip are coupled to a terminal of the carrier for front face wire and direct connector bonding.

In a practical embodiment, the electrical terminals are connected to respective wire bonding terminals through embedded vias in the chip carrier. In practice, as described below, the carrier may be formed of a plurality of layers, with the electrical connections between terminals disposed in an intermediate layer.

The support may include a generally planar flange with at least one wire bond terminal extending along a front surface of the flange into the chip receiving zone. This flange would not have any part of the terminals embedded in the carrier structure.

Advantageously, the carrier is formed of a non-magnetic material, such as a ceramic material, preferably Aluminium Nitride.

In the preferred embodiment, there is provided an electrically conductive bump pad associated with the or each electrical terminal. The bump pad acts as an electrical connection between the front facing terminals of the carrier and the rear facing terminals of the ion-trap chip.

Preferably, the or each electrically conductive bump pad is compressible between a chip and the support to form a mechanical bond between the chip and support. The or each electrically conductive bump pad is advantageously compressible by pressure under heat.

The or each electrically conductive bump pad is preferably made of gold.

In the preferred embodiments, the electrically conductive bump pad or pads attach a chip directly to the carrier.

According to another aspect of the present invention, there is provided an assembly of an ion-trap chip and an ion-trap chip carrier as specified herein, wherein:

the chip is disposed in the chip receiving zone of the chip support in the chip receptacle of the carrier, over the at least one generally planar flange, the chip including at least one rear facing terminal aligned with the at least one front facing electrical terminal of the chip carrier and electrically connected through the at least one front facing wire bonding terminal;

the at least one rear facing chip terminal being wire bonded at the front face of the carrier to a chip carrier output terminal.

Preferably, the carrier comprises first and second facing generally planar flanges on which the ion-trap chip is supported. Each of the first and second flanges preferably comprises an array of front facing terminals and the chip comprises first and second rear facing terminals substantially aligned with the flange terminals.

The carrier advantageously comprises a third generally planar flange disposed between the first and second flanges and on which the ion-trap chip is supported, wherein the third flange comprises an array of wire bonding terminals each comprising a first end extending underneath the chip and a second end extending outside the chip support zone and disposed at or on the front fact of the carrier.

In practice, the ion-trap chip is attached to the carrier by means of a plurality of bump pads, each bump pad being disposed between a reach facing terminal of the chip and the associated front facing terminal of the associated flange.

According to another aspect of the present invention, there is provided a method of making an ion-trap assembly as specified herein, including the step of disposing of the generally planar flanges a plurality of bump stops in the chip receiving zone, locating a chip on the carrier in the chip receiving zone, compressing the chip onto the carrier so as to compress the bump pads, wherein bump pad compression creates a mechanical and electrical bond between the chip and the carrier.

The bump pads are preferably compressed under pressure and heat, and in practice to around 50% of their initial height. They are advantageously are compressed under pressure of around 100 g per bump pad.

According to another aspect of the present invention, there is provided an ion-trap chip carrier comprising:

a generally planar carrier substrate, the substrate having a front surface, a rear surface, and a chip receptacle;

a chip support disposed in the chip receptacle of the carrier substrate, the chip support including at least one generally planar flange extending in or generally parallel to a plane of the carrier substrate, and at least one aperture therein, the chip support comprising a chip receiving zone;

the carrier being made of a non-magnetic material.

The carrier is preferably made of a ceramic material, or of aluminium nitride.

The teachings herein provide an ion-trap assembly having a one-sided wire bonding arrangement, in which the carrier includes at least a portion that underlies a portion of the chip to provide electrical interconnections thereto and mechanical support. Gold bump pads provide both electrical coupling and mechanical attachment of the chip to the carrier.

In practice, the teachings herein can provide a repeatable low cost, high volume design and subassembly process for mounting an ion-trap chip for use in UHV quantum environments.

Through a DFM approach it has been demonstrated that it is possible to remove the double epoxy process stages, including the multiple 4 hour curing cycles usually necessary, the double-sided wire bonding process and reduce the number of sub-assembly components to a single design which is scalable to volume manufacturing and associated cost targets. By using a bespoke carrier design, there are no requirements for modification processes such as a laser cut out, thereby reducing the risk of resin bleed-out and surface roughness.

The embodiments below focus on a 84LCC chip format, but it will be apparent that this is an example only.

By matching the ion-trap chip interconnect pads onto the carrier it is possible to completely remove the need for an intermediate AlN interposer, providing a single interconnect structure resulting in increased robustness, repeatability and reduction in cost and process times.

Therefore a single attach process is required (flip-chip) directly between the ion trap chip and the (preferably) ceramic carrier.

The epoxy attach process of the prior art is replaced with a gold bump pad thermo-compression flip-chip attach process between the carrier reverse-side bond pads with a placement accuracy of ≤5 microns is achievable.

The added benefit of using stud bumps and flip chip attach is to provide in-situ thermo-compression of the bump pads, maintaining the initial alignment accuracy, lost in prior art methods during thermal curing of the epoxy, as well as providing direct electrical contacts for one side of the double-sided ion-trap chip, thereby removing one side of a previously double sided wire bond process.

The bump pads also provide increased mechanical strength and robustness.

This can result in a bespoke ceramic carrier platform on which the overall footprint and I/O configuration can be designed for the specific chip used.

Ion microtraps particularly as disclosed herein are suited to a range of quantum technologies spanning sensors, clocks and quantum processors. They can form one of the key building blocks at the core of these systems, similar to the microchip in classical computers.

According to another aspect of the present invention, there is provided chip carrier comprising: a generally planar carrier substrate, the substrate having a front surface, a rear surface, a plurality of edges and a chip support; a plurality of wire bond pads for connection to electrical contacts of a chip; a plurality of arrays of electrical contact points disposed along the edges of the chip carrier and connected to the wire bond pads; wherein at at least one edge of the carrier there is provided a plurality of separate arrays of electrical contact points.

This arrangement can substantially increase the edge contact density per linear unit of chip edge or side compared to prior art arrangements and as a consequence reduce the necessary footprint of a chip carrier.

Preferably, there is provided a plurality of separate arrays of electrical contact points at each of the edges of the carrier.

In the preferred embodiments, the carrier substrate has a stepped profile at least at each edge provided with a plurality of arrays of contact points.

In an embodiment, the chip support is disposed in a chip receptacle of the carrier substrate, the chip support including at least one generally planar flange extending in or generally parallel to a plane of the carrier substrate, and at least one aperture therein, the chip support comprising a chip receiving zone; the at least one chip support including at least one front facing electrical terminal in the chip receiving zone, for coupling to a rear facing terminal of an ion-trap chip; and at least one front facing wire bonding terminal electrically coupled to the at least one front facing electrical terminal, the at least one front facing wire bonding terminal being disposed outside of the chip receiving zone; whereby a chip can be fitted to the carrier in the chip receiving zone with a rear facing electrical terminal in alignment with the least one front facing electrical terminal in the chip receiving zone and electrically connected through the at least one front facing wire bonding terminal, to be wire bonded from the front face of the carrier.

Other features, aspects and advantages of the teachings herein will become apparent to the skilled person from the specific description that follows.

BRIEF DESCRIPTION OF THE DRAWINGS

Embodiments of the present invention are described below, by way of example only, with reference to the accompanying drawings, in which.

DESCRIPTION OF THE PREFERRED EMBODIMENTS

Embodiments of the present invention are described below by way of example and not limitation. The skilled person will appreciate that the drawings are schematic only and do not necessarily show the components of the apparatus in any intended size or shape. While the disclosure herein identifies a plurality of different features for ion traps and carriers thereof, it is to be understood that these features will usually be used in combination. The disclosure herein therefore encompasses the features individually and combinations of the individual features, at the choice of the skilled person wishing to practice the teachings herein.

Figure 1:
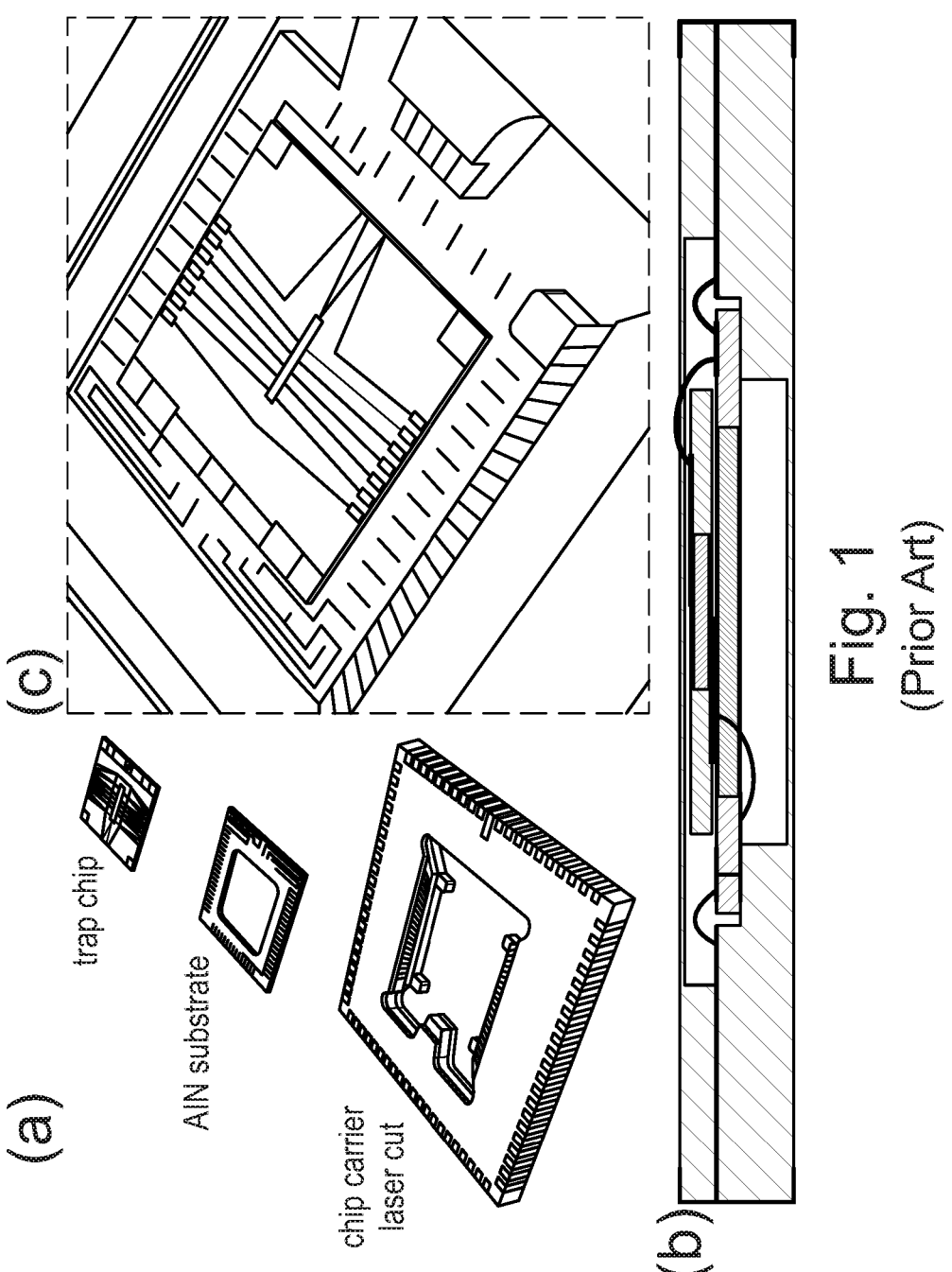
FIG. 1 is an exploded perspective view of an example of a known ion microtrap chip carrier.
Figure 2:
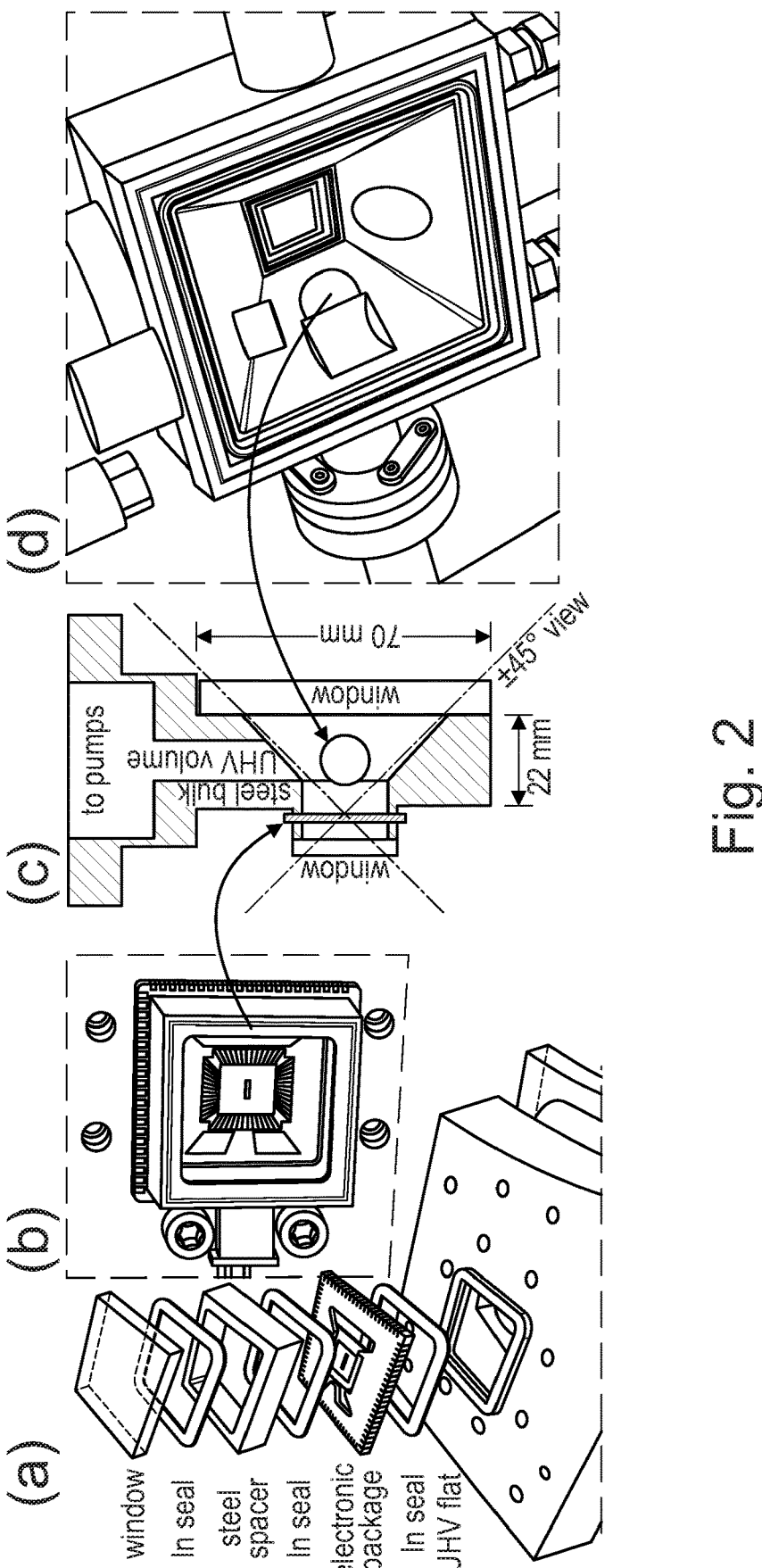
FIG. 2 is a series of views showing the components of a known ion microtrap assembly.

An approach developed by the applicant designed to exhibit these features comprised compact electronic UHV package for microtrap chips. An example is shown in FIG. 1, which includes a conventional ceramic leadless chip carrier (LCC) attached to a UHV chamber with cold-welded indium seals, as shown in FIG. 2. This provides an ultra-compact multi-contact feedthrough including the microtrap chip with 42 DC contacts and RF connectivity along the edges. This example used a conventional 84-pin alumina LCC containing gold-plated tracks for electronic packaging. Water-jet-guided laser cutting opens a through hole in the central part of the carrier, which can achieve a smooth and clean vertical cut through the alumina. The cut opens up orifices for optical access and vacuum conductivity through the LCC. Connections to DC electrodes are made along opposite edges of the LCC, while a third edge facilitates connections to the RF electrodes. The chip is double-sided, that is it contains electrodes on the front and back surfaces of the chip. In order to connect the electrodes to the single-sided chip carrier, a double-sided aluminium-nitride (AlN) substrate containing electrical vias is disposed between microtrap chip and LCC. The sandwiched stack is bonded together using a for instance heat curing epoxy (such as, Epotek H77), with the connection strong enough to survive repeated wire-bonding on both sides.

The assembly is designed to avoid thermal stress in the completed package due to differences in the coefficients of thermal expansion (CTE) in two ways. First, the use of AlN bridges the differences between the CTE of the silicon bulk of the ion-trap chip and the alumina of the LCC. Second, bonding is made by mean of ~1 mm² patches applied at the corners of the chip and AlN substrate. In this way the high CTE of the epoxy cannot cause the thermal stress that continuous bonding along the length of the substrates could. Altogether, the completed electronic package can withstand wide and rapid temperature cycles tested up to 280° C.

In FIG. 1 the electronic package is shown from its front-side surface. FIG. 1($a$) is an exploded view of the sandwiched package, with the RF contacts located on the left. FIG. 1($b$) is a cross-sectional view through the package, showing the paths connecting the trap electrodes to the LCC contacts; at the left hand side these being shown from the back surface of the chip along the AlN substrate through a via to the LCC; at the right hand side these being shown from the front-side surface of chip along the AlN substrate to the LCC. FIG. 1($c$) shows the inner part of the complete package, glued and wire-bonded as a working microtrap chip. In FIG. 1($c$) the RF contacts are shown on the right.

The chip has electrodes on both its front and rear sides. Standard packaging techniques are used for wire bonding to a single-sided device. The structure shown in FIG. 1 turns a two-sided wiring problem into a single-sided wiring problem with the use of the custom-made AlN substrate and the vias through it.

FIG. 2 shows the details of the UHV package. This advantageously comprises a straightforward and flexible electronic access to the trap electrodes, generates a pressure B10⁻¹¹ mbar at the ions, and has excellent optical access. To ensure straightforward air-side electronic access, the front-side surface of the LCC is attached to a small ledge (typically 2.6 mm wide and standing proud by 2 mm) on the face of the stainless-steel vacuum chamber, as can be seen in FIG. 2$a$). The vacuum volume is completed by attaching a small steel spacer and an optical flat to the rear surface of the LCC. For good UHV sealing, a 0.5-mm diameter indium wire is used and three such gaskets are fitted between the window, steel spacer, insulating surfaces of the LCC and the vacuum system. High pressure applied to the stacked components creates a cold-welded bond of the indium to all the surfaces. The indium seals (typically 2.6 mm wide, <100 μm high) bond the stack layers firmly together without the need for permanent clamping. A 0.5 mm insulating space is left between the weld and the electrical contacts, sufficient to apply a RF amplitude up to 700 V without surface flashover or electrical breakdown in air. The completed package, as shown in FIG. 2$b$), yields a miniature multi-pin electronic feedthrough for UHV and access to the trap centre from the air side with a path length of ≤20 mm. It will be appreciated that the dimensions given here are exemplary only.

Vacuum conductivity also prescribes the layout of the "UHV flat" shown in FIG. 2$c$, a custom-made stainless-steel cuboid on a DN40 ConFlat (CF) flange to which the electronic package is attached. An indium-sealed window opposite the LCC enables an unhindered view through the trap, as can be seen in FIG. 2$d$. The use of cold-welded indium can avoid any build-up of mechanical stress, even during bake-out.

The window layout enables optical access to the microtrap centre, corresponding to solid angles of $0.7\pi$ sr from each side of the trap. The range of possible viewing angles in the plane normal to the microtrap's z-axis is indicated in FIG. 2$c$ by the "±45° view". The thin electrodes of the microtrap enable optical access to the ion with a corresponding range of ±43°.

Figure 3:
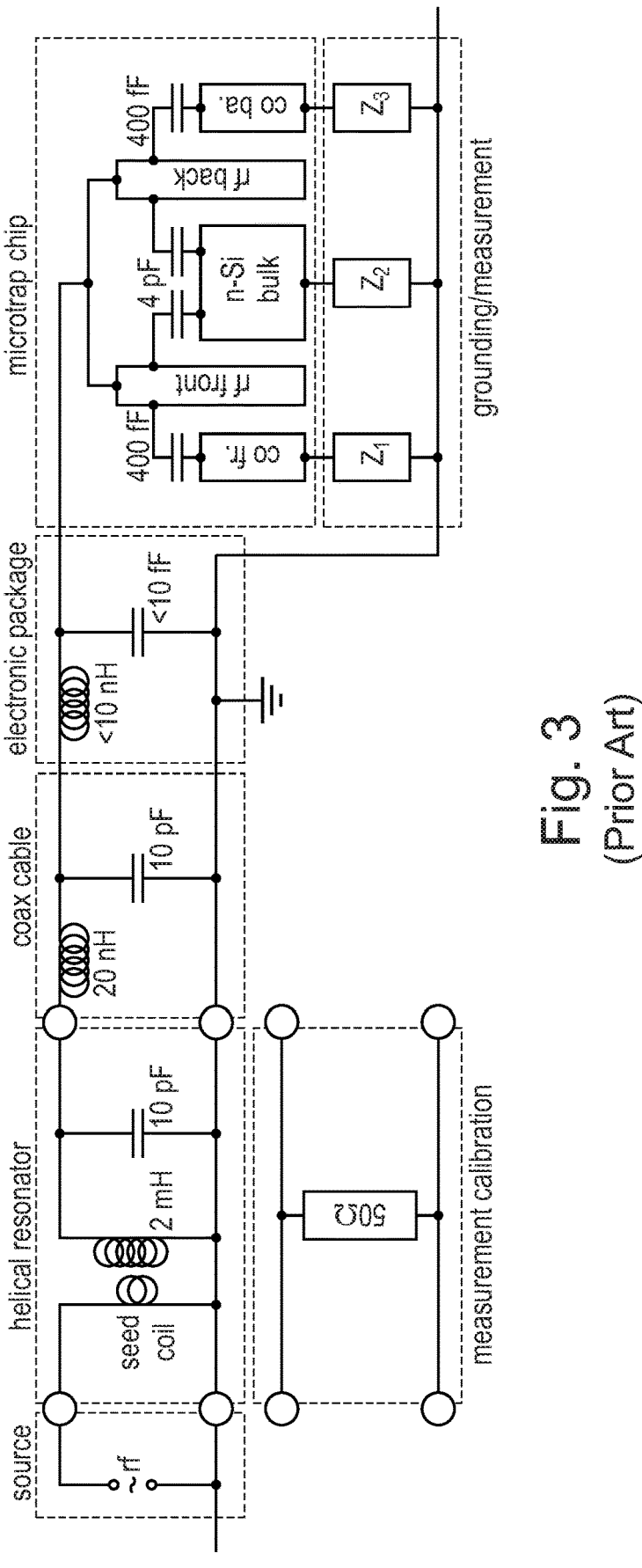
FIG. 3 is a circuit diagram of an example of high-voltage radio-frequency circuit for an ion trap.

FIG. 3 is a circuit diagram of an example of high-voltage radio-frequency circuit. Values are indicative only. For normal operation up to 1 W of RF power is fed with an impedance-matched seed coil into a helical resonator, the output of which is connected to the chip carrier via a short coaxial cable (of about 7 cm). Inside the electronic package, wire bonds connect to all the microtrap electrodes (shown for RF only). On the microtrap chip, capacitive coupling through a silicon dioxide layer connects the RF electrodes to a set of compensation electrodes (co fr.) on the front-side surface of the chip (of about 400 fF) and similarly on the rear surface (co ba.). Both RF electrodes also couple to the silicon bulk of the chip with a total of about 4 pF. All DC electrodes and the n-doped silicon bulk are kept at RF ground with filters fitted on the air side indicated by the impedances Z1, Z2 and Z3. These include the fixed electronic packaging contributions similar to the shown RF values. On the air side each of those can be replaced by a low impedance (B50 X) circuit to measure RF pick-up.

The low capacitive coupling of the RF electrodes to DC electrodes and the n-doped highly conductive silicon bulk separates the resonant circuit from the grounded electrodes (FIG. 3, Z1,2,3→0) to a high degree. With capacitances of 4 pF and smaller, reactances>>1 kΩ are achieved for typical drive frequencies up to 40 MHz.

This apparatus particularly when benefiting from the teachings herein can provide a miniaturised form of ion trap. Chip-scale components with scalable production are paramount for increasing the reach of quantum instruments and systems. These devices are manufactured using a microfabrication process capable of being scaled up to enable mass production. They also display the promise of high-performance (high quantum fidelities) while operating at room temperature. This makes them ideal for use in quantum technology applications from clocks to computers where high-fidelity quantum components are required.

The ion-trap chip carrier is typically assembled using an epoxy attach process with two separate sub-assembly components. The ion trap chip is epoxy attached to the AlN interposer, with double sided Au bond pads and interconnects including through hole vias. The sub-assembly is then epoxy attached to a modified (cut-out) ceramic 84LCC package. For both attachment steps a thermal cure of ≥4 hours is normally required. The ceramic package cut out is normally achieved by laser cutting, which can result in burred inner edges and a risk of resin bleed during manufacture, although, the bleed-out risk can be reduced with preparatory assembly process steps, such as cleaning followed by a vacuum bake out for 16 hours or more. A double sided wire bonding process provides connection of both surfaces of ion-trap chip to both surfaces of the AlN interposer.

The present invention seeks to provide an improved ion trap chip carrier, an improved ion trap assembly and an improved method of fabricating an ion trap assembly.

Figure 4:
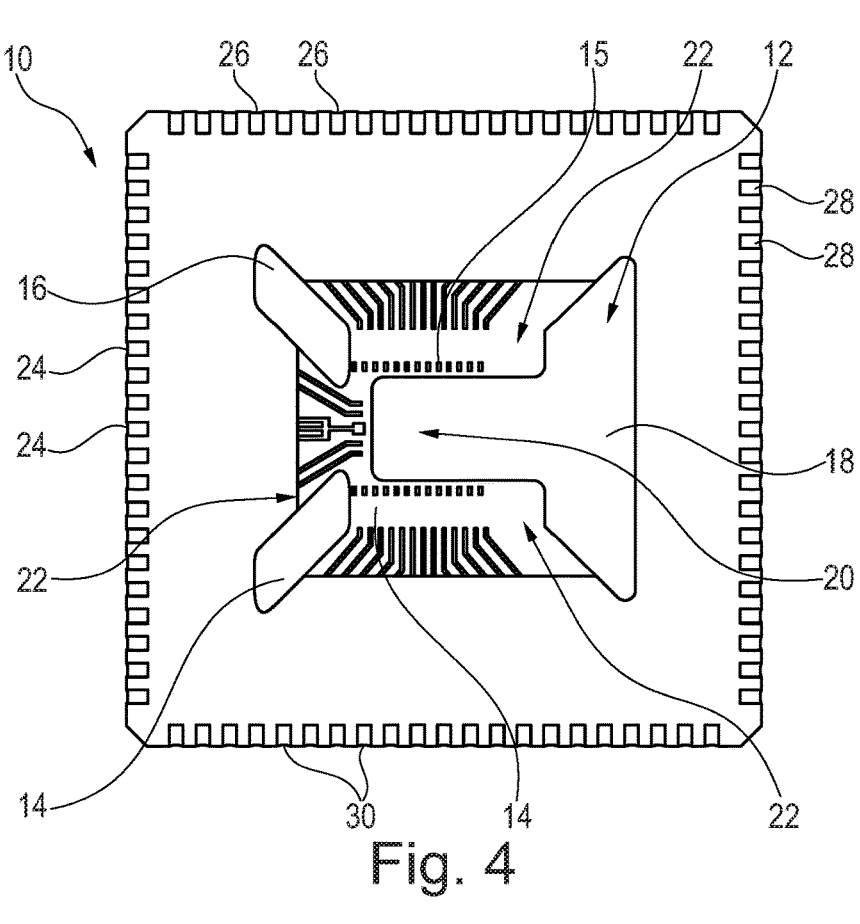
FIG. 4 is a top plan view of a preferred embodiment of chip carrier for an ion trap chip.

Referring now to FIG. 4, this shows a top plan view of an embodiment of ion-trap chip carrier 10, shaped in this example for a rectangular chip. The carrier 10 is configured to provide a 3-D ion trap in practice can provide a repeatable low cost, high volume design and a sub-assembly process for mounting an ion-trap chip for use in UHV quantum environments. As will be apparent in the description that follows, the chip carrier 10 has a structure and form that avoids the need for an intermediate AlN interposer, providing a single interconnect structure which can result in increased robustness, repeatability as well as a reduction in cost and process times. This is achieved in the preferred embodiments by matching the ION-trap chip interconnect pads onto the carrier.

A single attach process is required between the ION-trap chip and the carrier.

The conventional epoxy attach process is replaced with the use of mechanical and electrical couplings, described herein as bumps, preferably formed of gold and which can be thermally compressed in a flip-chip attach process between the chip and the carrier. The connections preferably provide both a mechanical fixation of the chip onto the carrier as well as the electrical interconnects at the reverse side of the chip to provide direct electrical contacts for the reverse side of a double-sided ion-trap chip. This removes the need to provide a reverse side wire bonding process previously required for double-sided chips and also the need for an AlN interposer.

An added benefit of using interconnects bumps of the nature taught herein is to provide in situ thermo-compression of the bump connects, maintaining the initial alignment accuracy which in earlier known systems would have been lost due to thermal curing of the epoxy.

It is has been found also that the use of metal, particularly gold, stud bumps adds increased mechanical strength and robustness.

The chip carrier 10 can be designed to have a bespoke shape and configuration, which enables the overall footprint as well as the input/output configuration of the carrier 10 to be altered if required for different applications and different shapes. It can also accommodate other connection applications and requirements.

The preferred embodiments provide a package design that is both repeatable and scalable.

The embodiment of chip carrier 10 in these embodiments has a generally planar form and is substantially square. This shape and configuration is chosen for particular application and is not to be regarded as a limitation to the disclosures herein.

The carrier 10 has a central receptacle 12 of generally square form with, in this example three apertures 14, 16 and 18. The primary aperture 18 provides an opening 20 at the centre point of the carrier 10 and bounded by a plurality of electrical interconnects, described in further detail below.

Within the receptacle 12 is a recessed base of the carrier 10 formed by what could be described as generally planar flanges 22 that extend in this example in a plane of the carrier 10 towards the central aperture 20. These flanges 22 include arrays of electrical interconnects for interconnecting with a reverse side of a chip (described in further detail below).

At the outer periphery of the carrier 10 there are provided four series of electrical contact points 24-30 for the electrical interconnects of the ion-trap chip.

Figure 5:
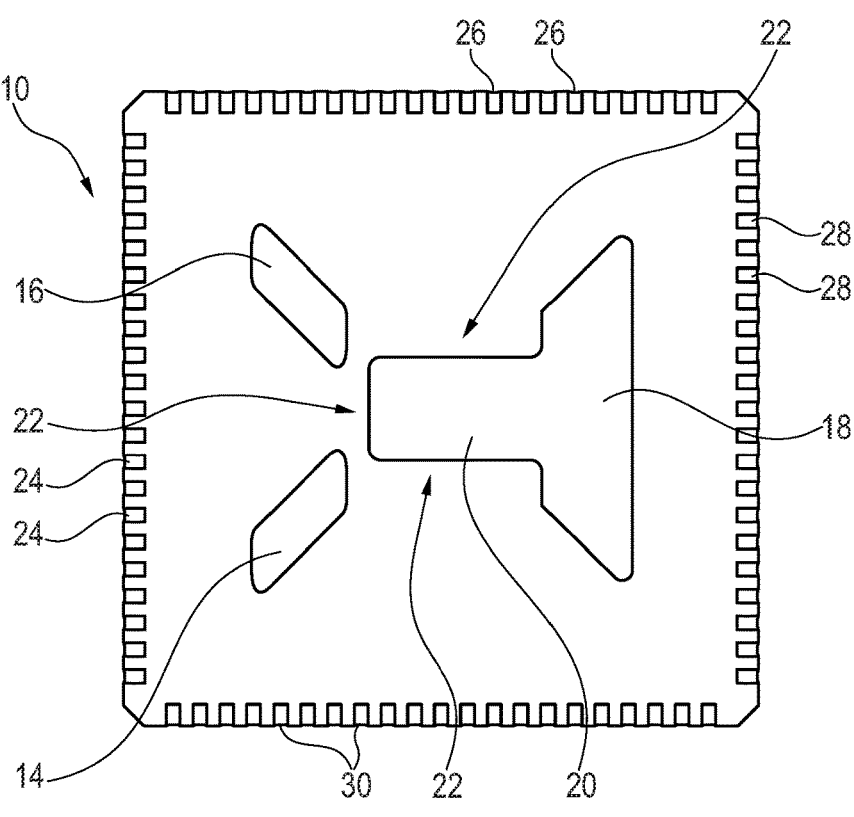
FIG. 5 is a bottom plan view of the chip carrier of FIG. 4.

Referring to FIG. 5, this shows the reverse side of the carrier 10 and from which it can be seen that the flanges 22 are co-planar with the lowermost surface of the carrier 10.

Figure 6:
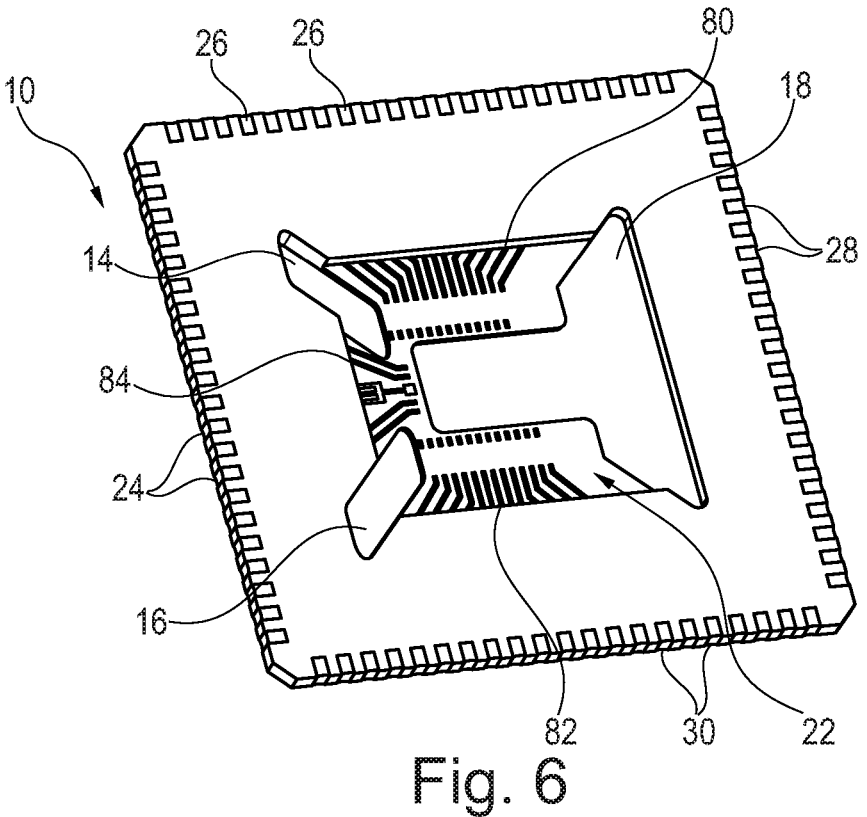
FIG. 6 is a top isometric view of the chip carrier of FIGS. 4 and 5.

FIG. 6 is a perspective view of the chip carrier 10, showing more clearly the recess formed by the flanges 22, achieved in this embodiment by having flanges that are thinner, that is have lesser depth, than the thickness of the remainder of the carrier 10. The depth of the recess provided by the flanges 22 is preferably such as to accommodate at least a major portion of the thickness of a chip, although this is not essential.

In some embodiments, at least a part of or the whole of the chip could extend above the plane of the carrier 10. For example, the top surface of the carrier 10 may be planar, that is without any recess, in which case the chip will rest on top of the upper surface of the carrier 10 with no part of the chip recessed within the volume of the carrier 10. However, this is not a preferred solution.

Figure 7:
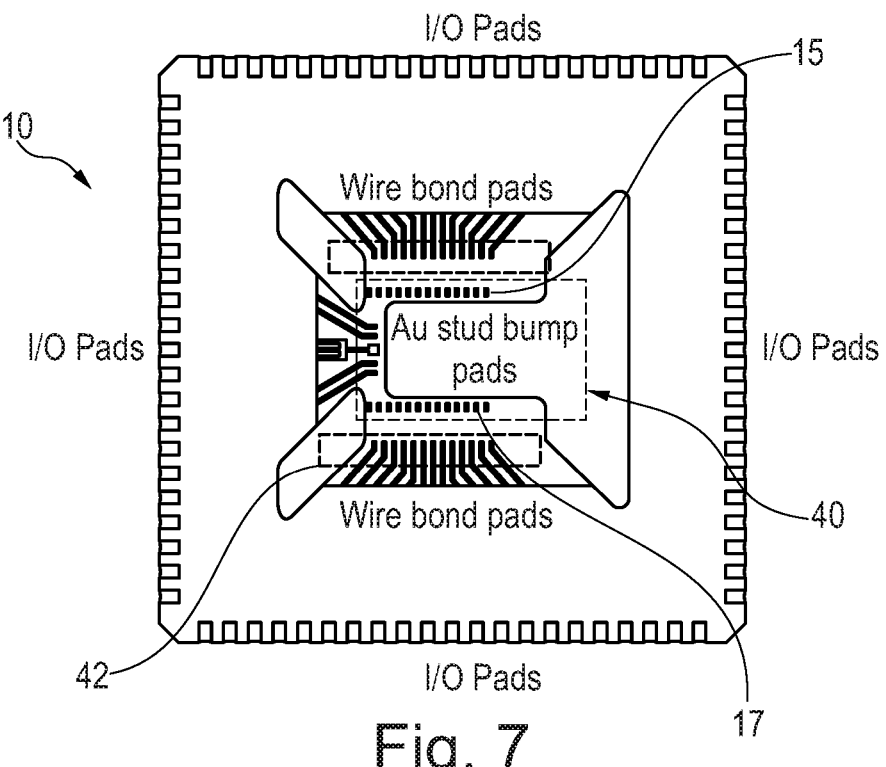
FIG. 7 is a top plan view of the chip carrier of FIGS. 4 to 6 showing solder bumps and the interconnect pad allocation for a chip.

Referring now to FIG. 7, this shows a plan view of the carrier 10 with, in dotted outline, the arrangement of front facing electrical terminals 15, 17 on the flanges 22, described in further detail below. There can also be seen the wire bonding interconnect pads, which are preferably made of titanium tungsten (TiW).

It will be apparent that the disposition and sizes of the flanges 22 and the disposition and number of front facing electrical terminals 15, 17 and wire bond pads are designed specifically to accommodate an ion-trap chip of associated design.

Figure 8:
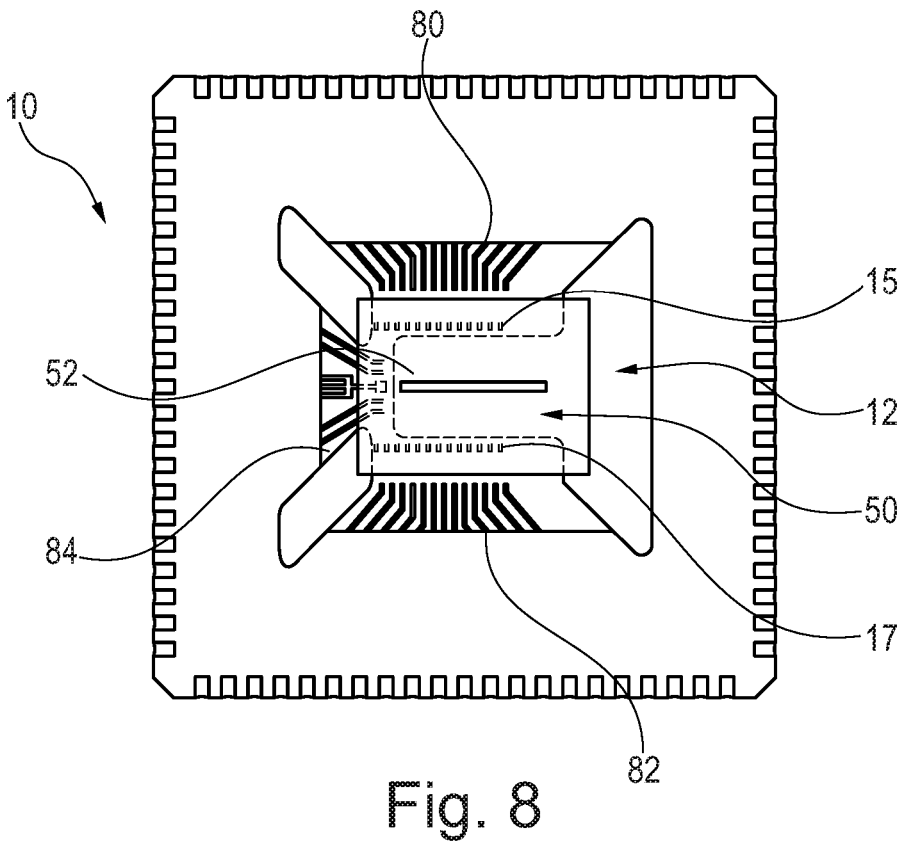
FIG. 8 is a top plan view of the chip carrier of FIGS. 4 to 7 with a chip in position on the carrier, the chip being shown in translucent form to make visible the solder bump bonding pattern.
Figure 9:
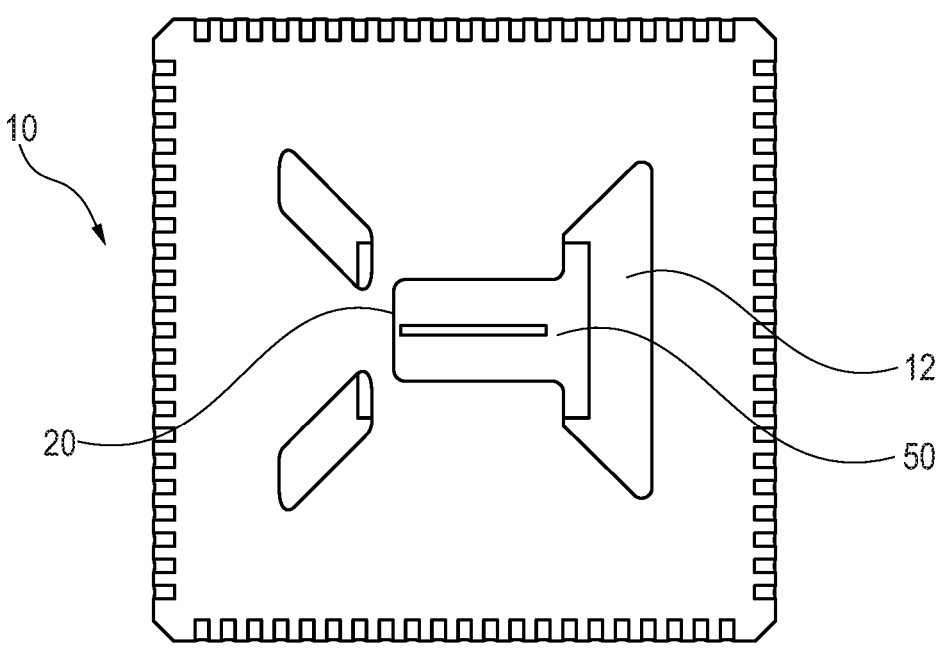
FIG. 9 is a bottom plan view of the chip carrier of FIGS. 4 to 8 with a chip in position on the carrier.
Figure 10:
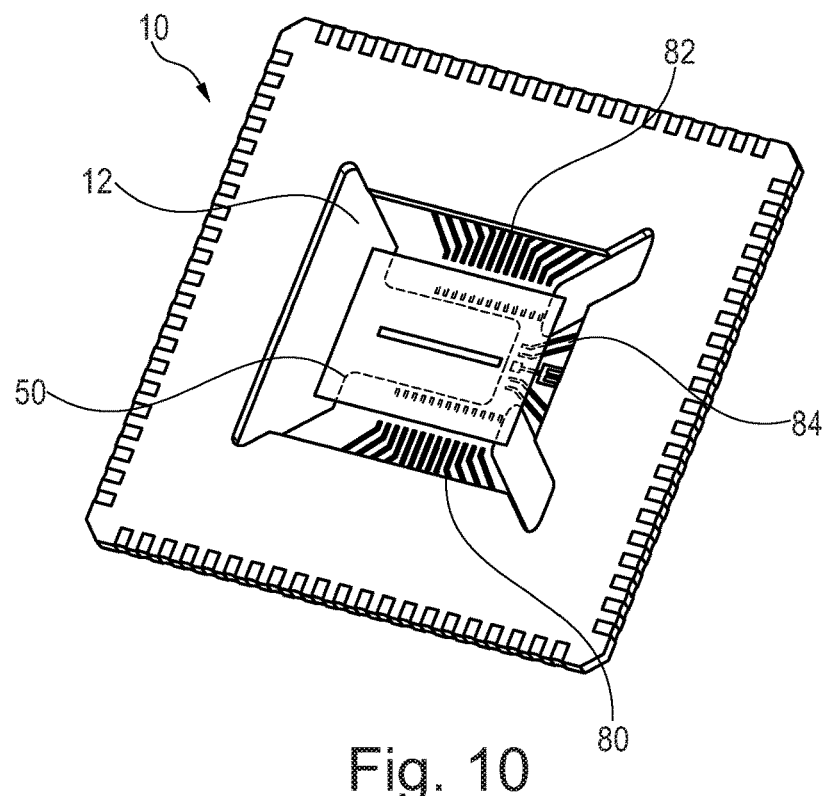
FIG. 10 is a top isometric view of the chip carrier of FIGS. 4 to 9 with a chip in position on the carrier, the chip being shown in translucent form to make visible the solder bump bonding pattern.

FIGS. 8 to 10 show the chip carrier 10 of FIGS. 4 to 6 with a representative chip 50, shown in translucent form, disposed in the central receptacle 12 of the chip, typically in a chip receptacle zone, that is the zone of the chip designed to receive the chip 50. The ion-trap chip 50 is of conventional form.

As can be seen, the chip 50 is disposed over the central aperture 20 of the carrier and overlies the front facing flange terminals 15, 17. The chip 50 also overlies the wire bond pads 84 provided on the chip carrier 10. The chip 50 has a central aperture or slot 52, as is known in the art.

Figure 11:
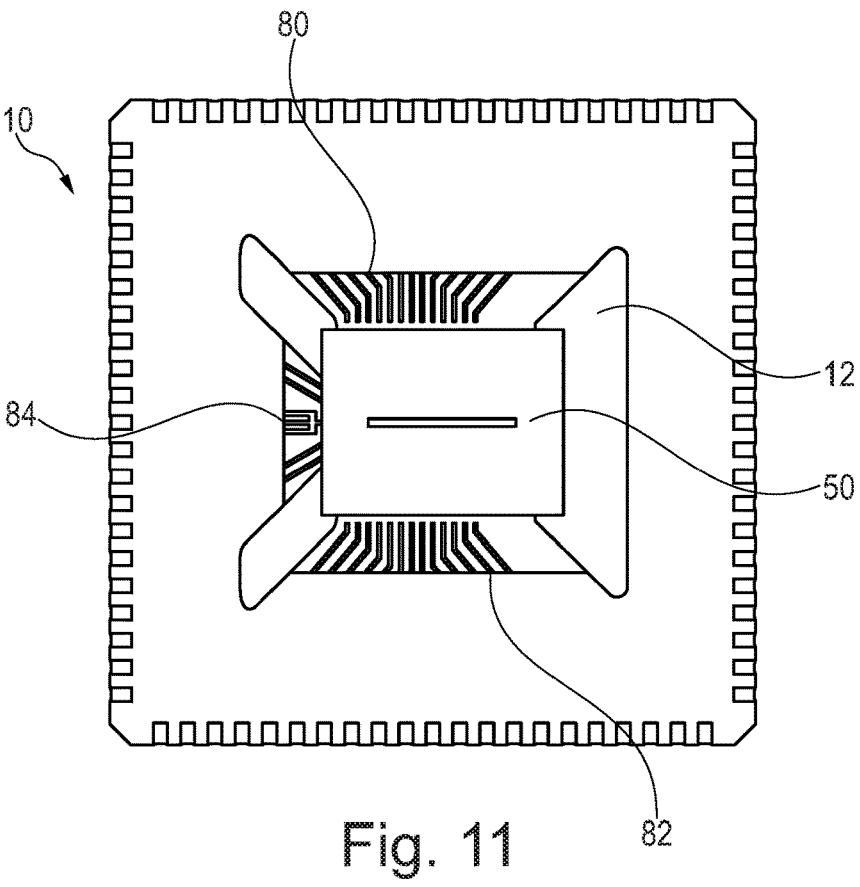
FIG. 11 is a top plan view of the chip carrier of FIGS. 4 to 10 with a chip in position on the carrier, as it would be viewed in practice.
Figures 12, 13:
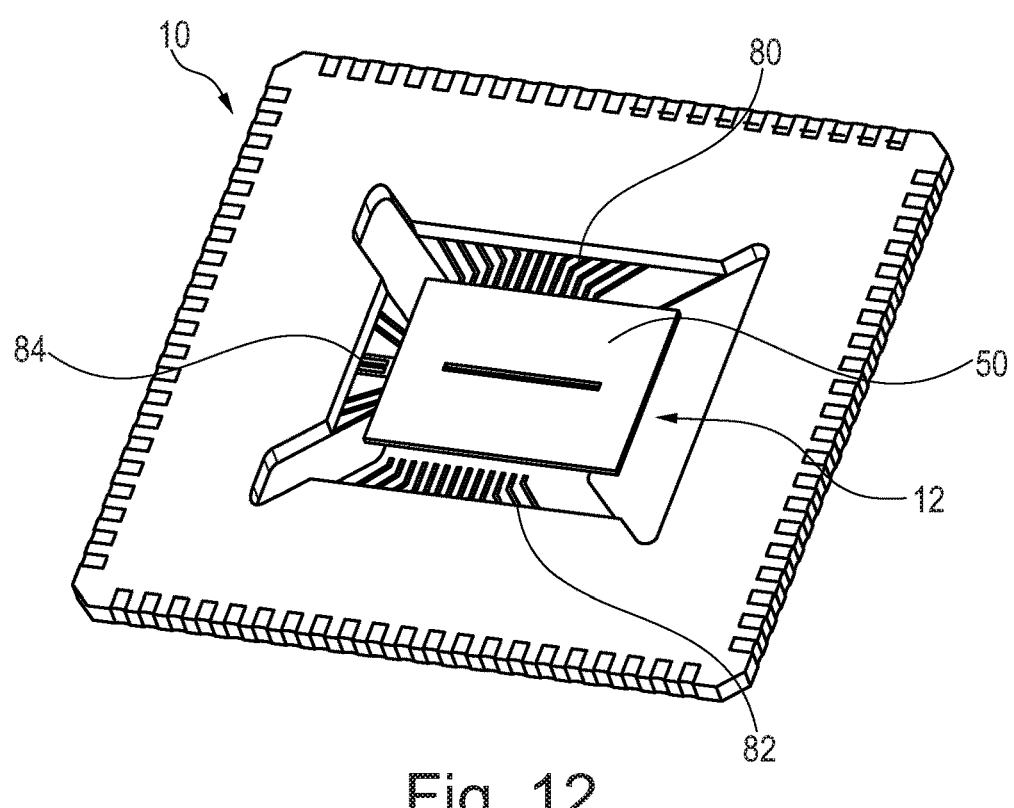
FIG. 12 is a top isometric view of the chip carrier of FIGS. 4 to 11 with a chip in position on the carrier, as it would be viewed in practice.
FIG. 13 is a scanning electron micrograph image of an array of gold solder bumps for use in the chip carrier of FIGS. 1 to 12.

FIGS. 11 and 12 show a representative chip placed on the carrier 10, in solid form and masking the front facing electrical terminals 15, 17 of the flanges 22 and at least a part of some of the wire bond terminals 84.

Referring now to FIG. 13, this shows a photograph of the preferred embodiment of bumper studs or pads 60 for the chip carrier assembly 10, 50. The studs or pads 60 are preferably made of gold and may be formed using a process derived from wire-bonding techniques. In this embodiment, a 25 micrometre diameter gold wire was used (similar to that that can be used for wire bonding) with the diameter of the wire largely determining the dimension of the bumps. The bumper studs or pads 60 can be produced in bulk by cutting from a wire and pressed into their initial shape, that is to have a relatively large diameter base and a smaller diameter upper portion, in this embodiment of conical form.

The bumper studs or pads 60 would typically have a height in the region of 100 micrometres prior to compression. However, it will be appreciated that the dimensions of the stud bumps 60 may vary in dependence upon the dimensions of the carrier, the spacing between its underside terminals, the number of bumper pads used and so on.

The bump studs or pads 60 are preferably formed in the shape shown by axial compression of a length of gold wire, which compression would cause the wire to expand radially outwardly at its base, in this example to a diameter of around 75 micrometres and a height of greater than 50 micrometres.

This compression creates the rounded form of the base of each bump stud or pad visible in FIG. 13, and enables the formation of the conical upper portion.

Figure 14:
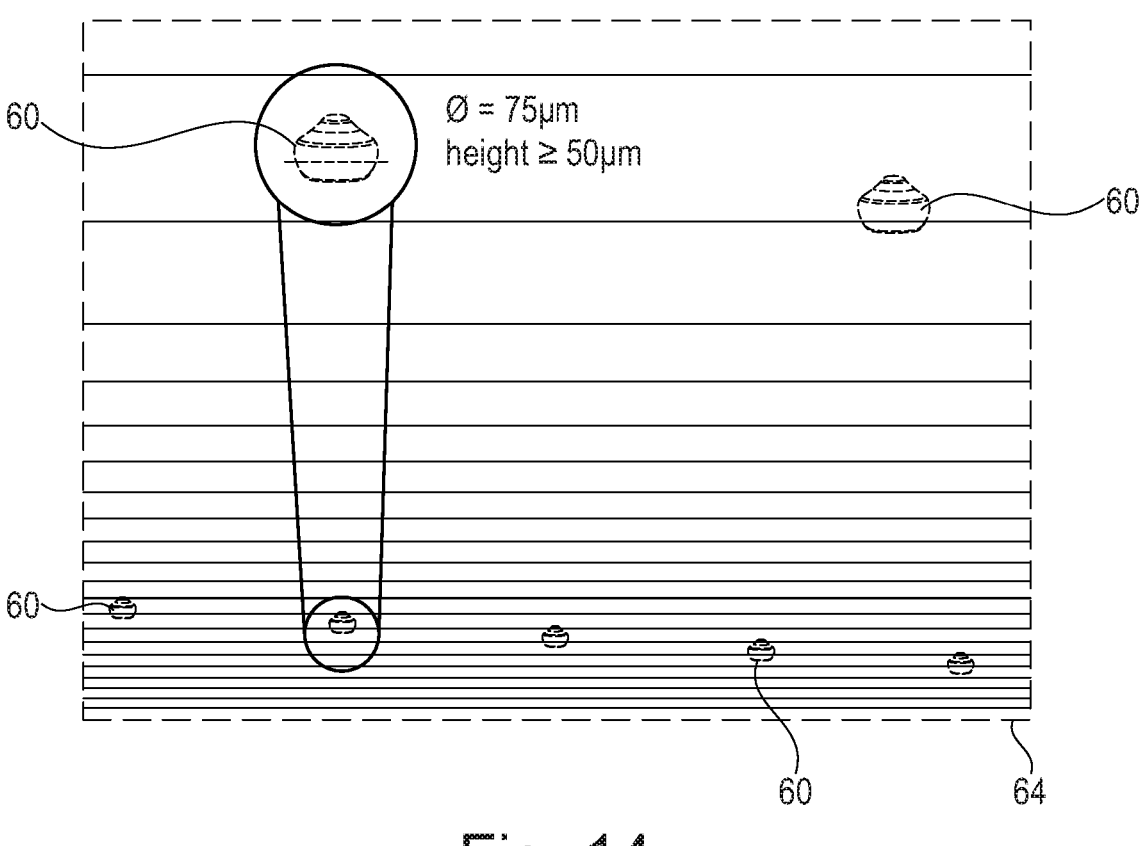
FIG. 14 is a scanning electron micrograph image showing an enlarged view of a preferred embodiment of solder bump prior to use.

Referring to FIG. 14, this shows an example of the bump studs or pads 60 disposed on a substrate 64, equivalent to the flanges 22 of the chip carrier 10, prior to the attachment of a chip thereto. This is an image of an actual gold stud bump after being applied to a TiW/Au surface representative of the chip carrier bond pad.

Figure 15:
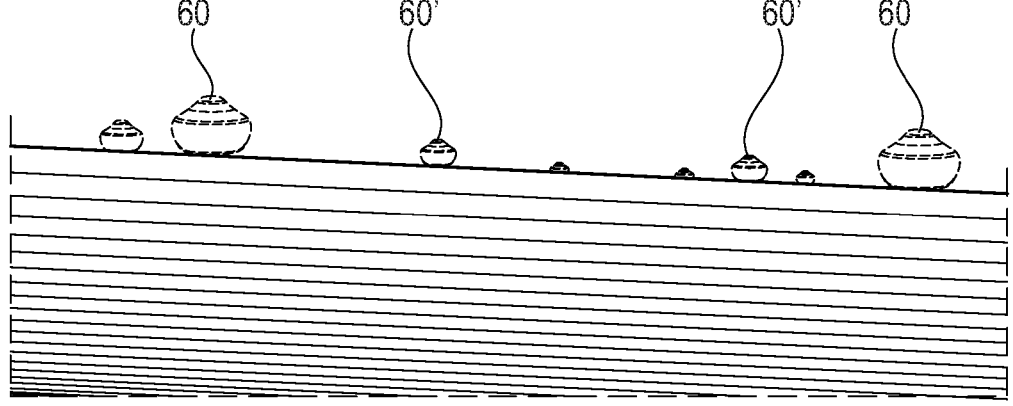
FIG. 15 is a scanning electron micrograph image showing a side elevational view of solder bumps prior to use.
Figure 16:
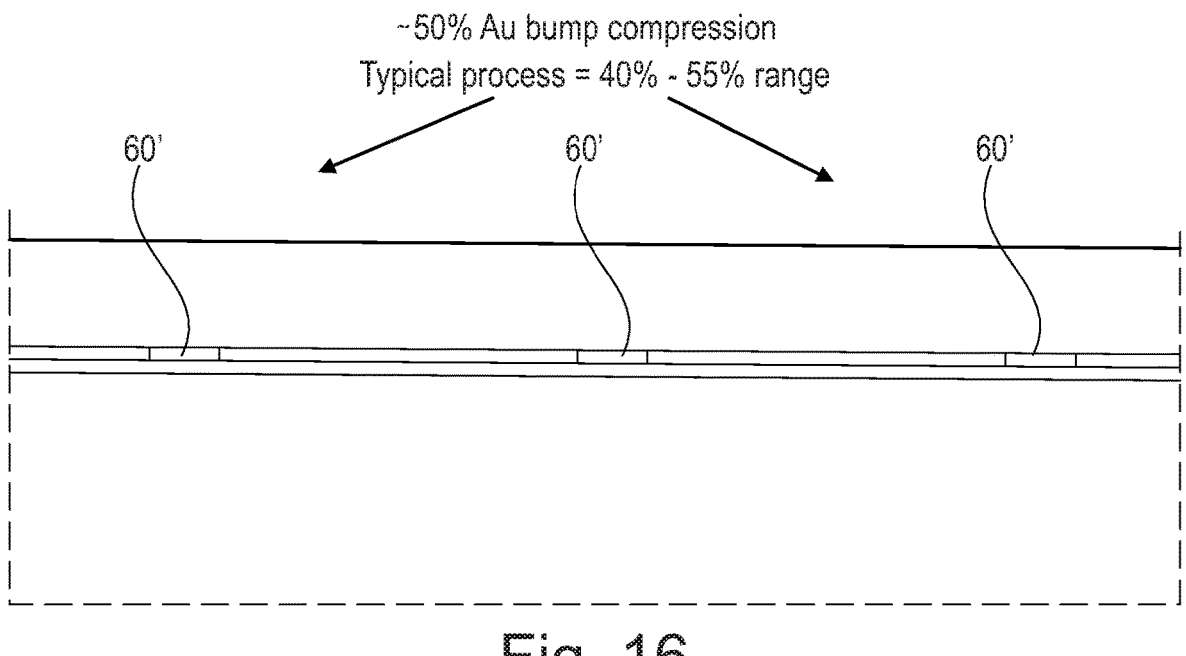
FIG. 16 is a scanning electron micrograph image showing a side elevational view of a preferred embodiment of solder bump after thermal compression.

In practice, a chip 50 is pressed onto the carrier 10 and onto the bump studs or pads 60 with a force sufficient to compress the bump studs or pads 60 to create a mechanical and electrical bond. It has been found that a force of 28 g over a time of 28 milliseconds and at power of 0.7 microme-tres of ultrasonic movement will cause thermo-compression of the gold bump studs or pads 60 during the chip attachment process and will firmly bond the chip 50 to the chip carrier 10. Typically, such compression parameters will compress the gold bump studs or pads 60 to around 50% of their original height, as will be apparent in FIG. 15, which compares to the bump studs 60 in their original condition with bump studs 60' after compression. A typical process could expect to see a compression of the gold stud bumps between 40%-55%, as depicted in FIG. 16.

Figure 17:
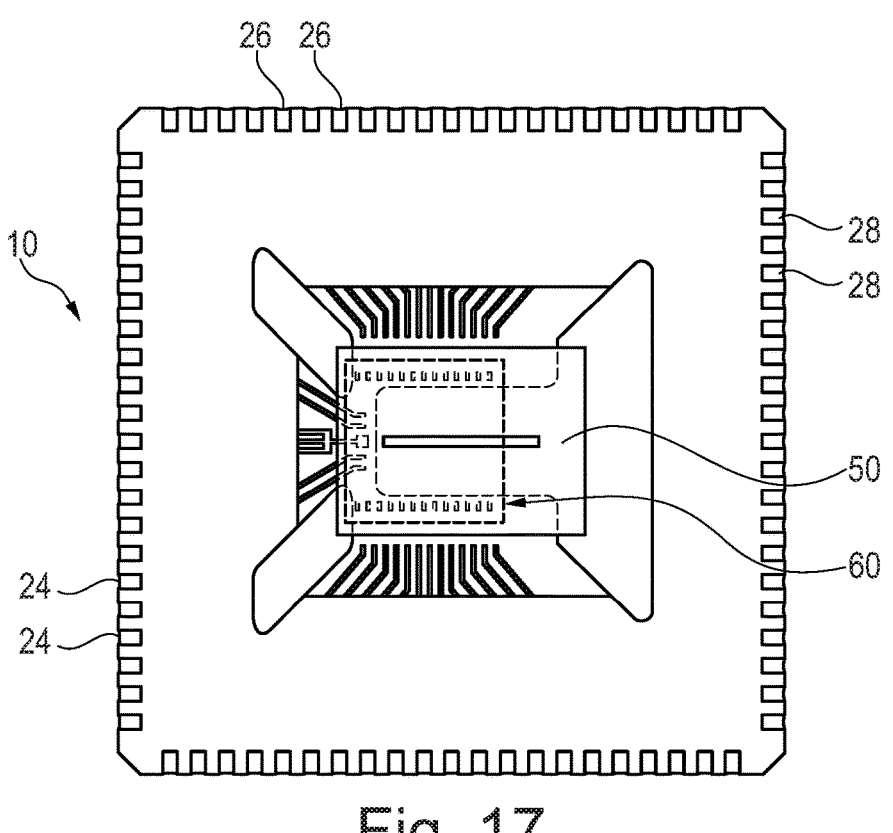
FIG. 17 is a top plan view of the chip carrier of FIGS. 4 to 12 showing the disposition of the solder bumps on the carrier.

With reference to FIG. 17, the gold bump studs or pads 60 are disposed on the chip carrier 10 in the locations of the front facing electrical terminals 15, 17, to correspond with the terminals on the reverse side of the ion-trap chip 50.

The bump studs or pads 60 can be located on the carrier chip 10 with an accuracy of 5 micrometres or less, which provides for excellent repeatability and scalability of the process. The bump studs or pads 60 can be initially attached to the carrier chip 10 by the same method as wire bonding, by compression, by adhesion, or by any other suitable method.

Destructive shear testing of a sample chip onto the chip carrier 10 has demonstrated that the gold bump studs or pads 60 have an attachment force around 100 g per stud bump and that a typical set of such stud bumps will provide a signifi-cant holding force of a chip on the chip carrier. It has been found also that by this attachment process the gold studs or pads 60 become permanently attached to terminal pads of a chip, demonstrating the efficacy of the studs or pads and also the attachment process.

It will be appreciated that the number, arrangement and disposition of the studs or pads 60 will be dependent upon the shape and structure of a chip 50 fitted to the chip carrier 10 and in particular the electrical interconnects on the rear surface of the chip. This is, though, a matter of routine assembly processes having regarding to the teachings herein.

While in the preferred embodiment every stud or pad 60 provides both mechanical and electrical interconnection, it is to be understood that the stud bumps or some of them may be used to provide solely mechanical interconnection, that is they are not connected to any terminal of the chip or chip carrier. This may be desirable in situations where additional mechanical strength is desired between the chip and the chip carrier.

It will also be appreciated that the support flanges 22 of the chip carrier 10 are also shaped, sized and positioned in dependence upon the design of the chip carrier and both in terms of its physical shape and dimensions and also in terms of its rear surface electrical terminals.

It is to be appreciated that by using a bespoke design of the carrier 10 it is not necessary to modify the carrier 10, such as providing a laser cut out, which reduces the risk of surface roughness and resin bleed-out.

By matching the ion-trap chip interconnect pads 60 onto the carrier 10, it is possible to eliminate the need for an intermediate AlN interposer, which provides a single inter-connect structure resulting in an increased robustness, repeatability and reduction in cost and process times. A single process is required to attach a chip to the carrier and it also avoids the need for an epoxy attachment as is required with prior art devices. It is possible to place a chip onto the carrier with an accuracy of 5 micrometres of better. The in-situ thermo-compression of the stud bumps 60 maintains the initial alignment accuracy, which in prior art systems would have been lost during the thermal curing of the epoxy adhesive. It also provides direct electrical contact for one side of a double-sided ion-trap chip, thereby removing one side of a previously double-sided wire bonding process. This results in a bespoke carrier platform on which the overall footprint and the input/output configuration can be altered as necessary to accommodate different chip designs. The input/output terminals of the chip carrier can also be modified to accommodate other connection applications and require-ments.

The chip carrier is preferably made of ceramic or other non-magnetic material.

In one embodiment, the chip carrier 10 is formed of faced back sub-layers of aluminium nitride (AlN) which accom-modates a triple layer metal interconnect design with through-layer interconnect vias. The thickness of the top layer can be tailored to a preferred optimum height. The height (thickness of the top layer) may typically range from 0.2 to 0.6 mm. For such a design, each layer may have a minimum thickness of around 0.2 mm. Use of a thicker top layer can allow the top surface of the ion trap to be lower than that of the ceramic top surface of the chip carrier, contributing to added robustness of the assembly.

As will be appreciated, the pitch or spacing of the outer input/output connections may remain the same as existing designs, with the number of connections tailored to suit the number actually required by any particular ion-trap chip. Selective placement of wire bonds and studs or pads 60 can determine which input/output connections are used.

Around the outer edge of the chip carrier 10 the input/output pad structures 24-30 are preferably maintained and may or may not be electrically connected. Maintaining the arrangement of these input/output pads 24/30 can maintain a uniform height along the outer edges of the chip carrier 10 for ease of securing the carrier 10 to support of an ion trap.

Figure 18:
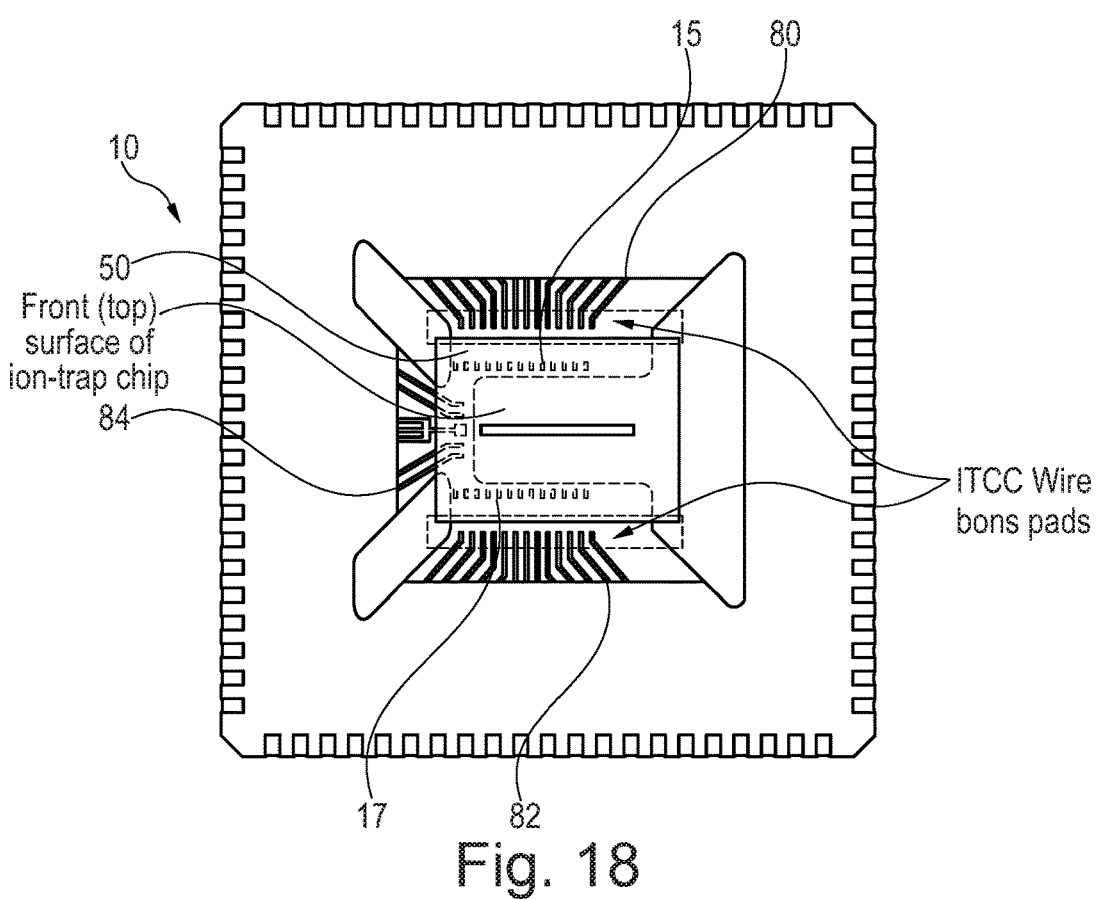
FIG. 18 is a top plan view of the chip carrier similar to FIG. 17, showing the location of pads where gold wire bonds are in practice located on the top surface of the ion trap chip.

Referring now to FIG. 18, as will be apparent, the ion-trap chip 50 in this embodiment is disposed on the chip carrier 10 spaced from the arrays of wire bond pads 80, 82, although electrically coupled thereto via the studs or pads 60 and the electrical interconnections through the front facing flange terminals 15, 17, to the wire bond terminals 80, 82. The gold studs or pads 60 act as a mechanical and electrical connec-tion between the rear facing terminals of the integrated circuit chip 50 and the front facing pad terminals 15, 17.

Figure 19:
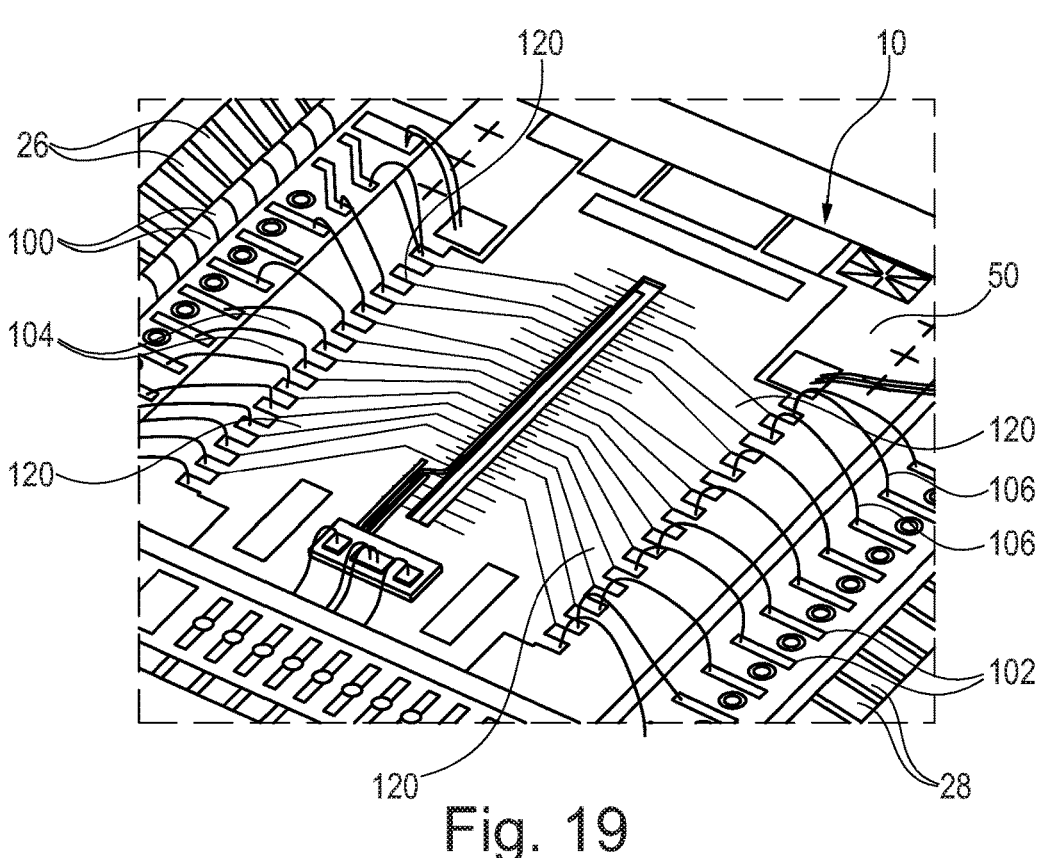
FIG. 19 is a perspective view of the chip carrier with a chip installed and wire bonded to the pads of the carrier.

FIG. 19 shows another embodiment of microtrap chip packaged in the same fashion as the earlier described embodiments, with the aluminium nitride interposer between the microtrap chip and the ceramic leadless chip carrier (CLCC). As can be seen in FIG. 19, wire bonds can be made from the top side terminals 120 of the chip 50 the edge terminals 26-30 of the chip carrier 10, while wire bonds 100 can equally be made from top surface of the assembly for the rear facing chip terminals. These include the RF connections for the ion-trap chip without the need for any specialised RF design considerations.

As the wire interconnects are provided from the top surface of the assembly, the assembly process is significantly simplified. Moreover, the mechanical and electrical interconnection via the bump pads 60 is precise and repeatable, so as long as the chip is correctly aligned (specifically the underside terminals thereof) with the bump studs or pads and the chip carrier. Assembly can be precise and repeatable as and reliable fabrication can be assured.

Figure 20:
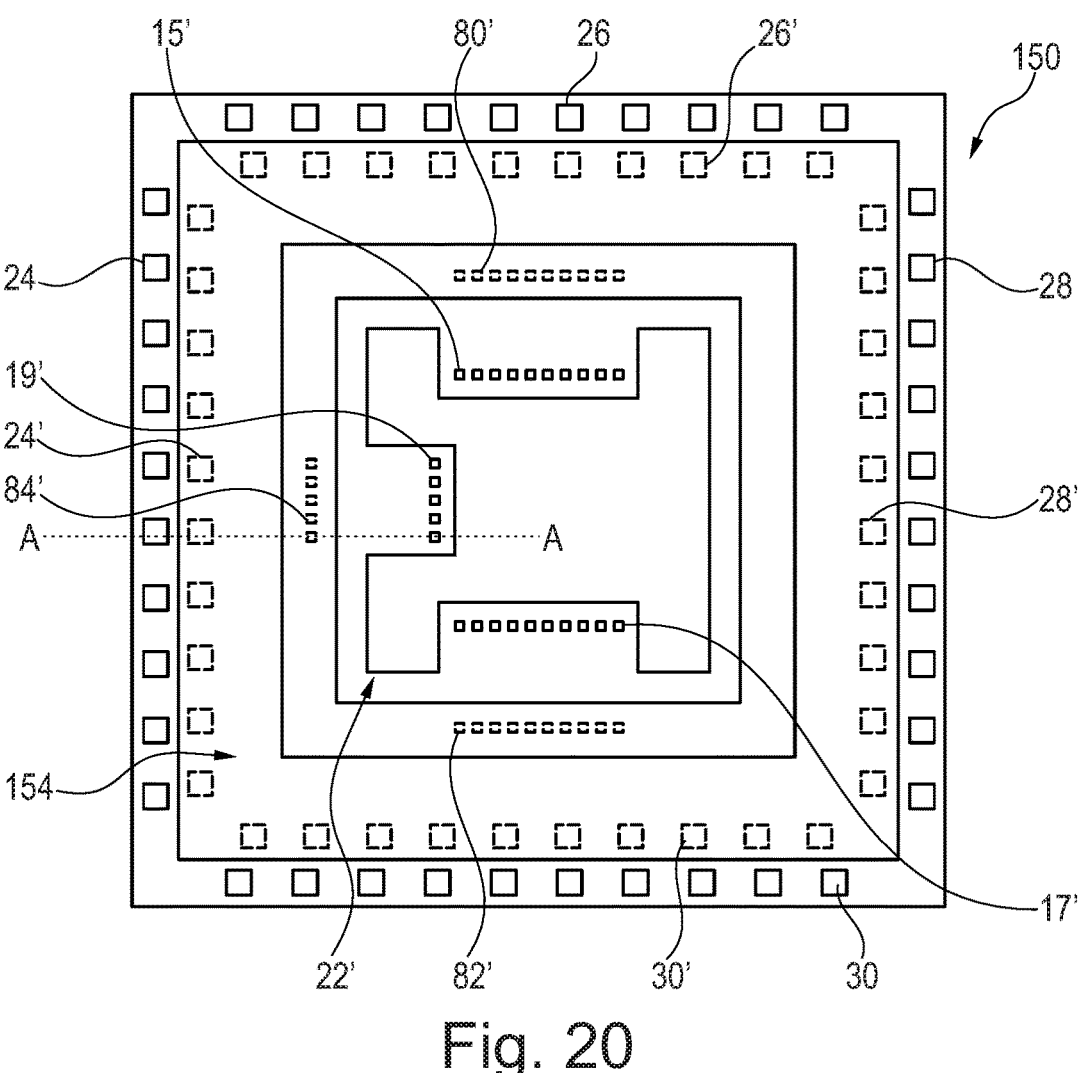
FIG. 20 is a schematic plan view of another embodiment of ion microtrap chip carrier.
Figure 21:
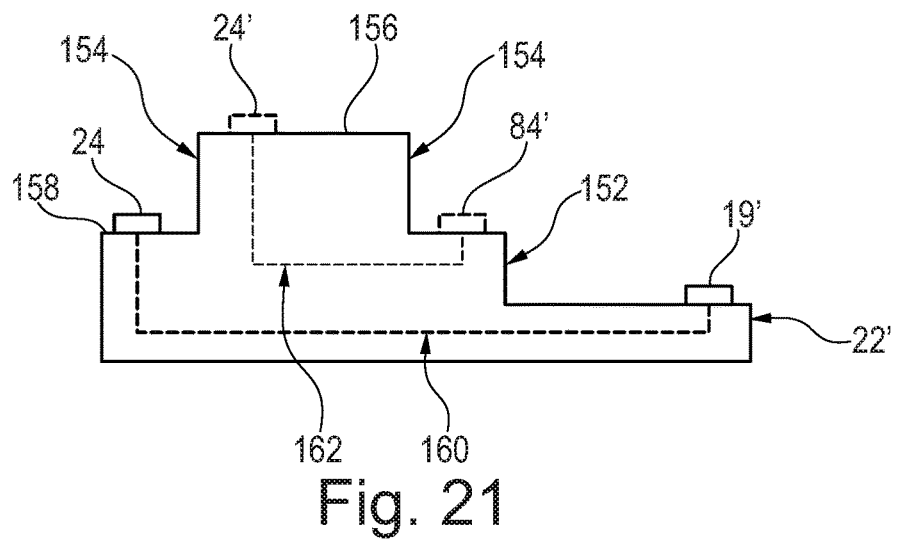
FIG. 21 is a part cross-sectional view across line A-A of FIG. 20.

FIGS. 20 and 21 show another embodiment of ion microtrap chip carrier 150. The overall structure of the carrier 150 is the same as that of the embodiment of FIGS. 4 to 12. The difference lies with the arrangement of and provision for the electrical contact points at the sides or edges of the carrier 150. While in the embodiment of FIGS. 4 to 12 there is provided a single array of contact points 24-30 at each side, in conventional manner, this embodiment provides two arrays of contact points 24, 24'; 26, 26'; 28, 28' and 30, 30' at each side of the carrier 150.

Referring first to FIG. 20, the chip carrier 150 includes, as with the previously described embodiments, three arrays of chip underside wire bond pads 15'-19', which in use connect to underside terminals of a chip 50, preferably by means of gold bumper studs or pads 60, as described above. The carrier 150 also includes three arrays of front side wire bond pads 80'-84' for connection to the front side terminals of the chip 50. The chip underside wire bond pads 15'-19' are located on the flanges 22' of the carrier 150, which also support the chip 50.

With reference now also to FIG. 21, the underside wire bond pads 19' are connected through embedded conductive lines 160 to respective side contact points 24, at the outer perimeter of the chip carrier 150. The front side wire bond pads 84' are connected through embedded conductive lines 162 to respective contact points 24' in the second array of side contact points of the chip carrier. For this purpose, and to ensure that the two arrays of contact points 24, 24' on each side of the chip carrier 150 can be kept separate, the chip carrier includes a stepped platform or rib 154, which in this embodiment extends parallel to the side perimeter of the chip carrier as will be apparent from FIG. 20. The raised platform or rib 154 creates two support surfaces 156, 158 at different heights for the two arrays of edge contact points 24, 24'. As a result, the two arrays of contact points 24, 24' are kept separate and are able to be connected to coupling wires while being kept electrically separated.

It will be apparent that the arrangement is the same for the other arrays of edge contact points 15'/26, 80'/26', 17'/30 and 82'/30'. It will also be appreciated that the edge contact points 28/28' will couple to appropriate wire bonds pads 15-19, 80-84 as appropriate to complete the electrical connections from the wire bond pads to the edge contacts.

The embodiment of FIGS. 20 and 21 has the effect of doubling the number of contact points at the sides or edges of the chip carrier per length of edge/side compared to a conventional chip or chip carrier, enabling a substantial reduction of the footprint or surface area of the chip carrier. This can provide a substantial advantage in reducing the size of the apparatus.

While the embodiment of FIGS. 20 and 21 provides two arrays of contact points at each side/edge of the chip carrier, it is to be understood that more than two arrays could be provided on each side/edge, such as three or more. Advantageously, each array is on a separate step or level at the side of the chip carrier.

Specifically, this approach maximises the number of contacts to a two-sided chip while minimising the footprint of the carrier. A third or other additional layers at the perimeter could be used to incorporate more connections from the ledges in the carrier's cavity to it's external surfaces. It is possible to route the conductors from one layer in the cavity to another layer of contact pads around the carrier perimeter.

This embodiment is particularly advantageous for ion microtrap applications but is equally applicable to other uses and is not limited to chip carriers only. The principles could equally applied to chip housings and carriers for other purposes.

The ion-trap chip carrier assembly 10/60 of the preferred embodiments is intended for operation in a low magnetic field, in which typical metal adhesion layers, for example, nickel, may not be suitable. For this purpose the ion-trap chip and carrier assembly is preferably made of non-magnetic metals, including the adhesion pads to interconnect the traps and the bond pads. The electrically conductive elements of the assembly are preferably made of an alloy of titanium and tungsten, and gold throughout. Due to the relatively low RF requirements and the redistribution designed through existing connections, the metal thickness of all interconnect traps can remain as standard. The titanium/tungsten layers may have a thickness typically between 400-1000 Angstroms and the gold bond studs or pads typically a thickness of 3-5 micrometres.

The replacement epoxy attach material, such as H77 epoxy typically used, with gold bump studs or pads has also been found to reduce the risk of out-gassing in UHV environments.

In summary, in order to achieve non-magnetic or minimally magnetic properties, the assembly preferably avoids the use of nickel and other magnetic materials, including adhesion layers such as nickel and chromium, which are magnetic and should be avoided in contact pads and in the tracks between pads.

Non-magnetic materials (such as titanium, tungsten) are preferably used as an adhesion layer. Embedded conductors could also be made of tungsten or gold. Gold is preferably used as the conductor on the external surfaces (such as the pads or exposed tracks), because it is a good conductor and does not oxidise, as well as being non-magnetic.

Other metallic materials with good electrical conductivity may be used, such as copper and silver, but preferably in locations where they are not susceptible to oxidation.

Therefore, the structure will advantageously use a non-magnetic adhesion layer for the gold contact pads and exposed tracks. The embedded conductors should be of non- or low-magnetic material, which could include tungsten.

The use of aluminium nitride for the body of the ion trap chip carrier 10, preferably with 0% porosity, is particularly suitable for UHV applications and is also suitable because it has close thermal matching properties with silicon, of which the ion-trap chip 50 is typically made. While aluminium oxide can also be considered on the basis of its possible 0% porosity capability, the thermal matching properties of aluminium nitride to silicon makes this a preferred material for the body of the chip carrier.

The retention of the three-dimensional electrode geometry in the assembly can provide near-ideal trapping potential suitable for wafer-scale microfabrication techniques. It provides very good ion heating rates at room temperature, with low intrinsic noise for quantum applications, particularly at room temperature.

The skilled person will appreciate that the embodiments taught herein avoid the need for an aluminium nitride interposer between the ion-trap chip and the chip carrier substrate. It also removes the need for post processing laser cutting, cleaning and time consuming vacuum bake outs necessary with prior art assemblies, as well as the avoidance of epoxy bonding processes and necessary thermal curing cycles for bonding. The use of the bump studs or pads 60 can provide alignment accuracy around 5 micrometres or less, the ability to maintain that initial alignment accuracy wherein fitting the ion-trap chip onto the carrier.

All optional and preferred features and modifications of the described embodiments and dependent claims are usable in all aspects of the invention taught herein. Furthermore, the individual features of the dependent claims, as well as all optional and preferred features and modifications of the described embodiments are combinable and interchangeable with one another.

The disclosures in United Kingdom patent application number 2017249.0, from which this application claims priority, and in the abstract accompanying this application are incorporated herein by reference.

The invention claimed is:

1. An ion-trap chip carrier comprising:
a generally planar carrier substrate having a front surface, a rear surface, and a chip receptacle;
a chip support disposed in the chip receptacle of the generally planar carrier substrate, the chip support including at least one generally planar flange extending in or generally parallel to a plane of the generally planar carrier substrate, and at least one aperture therein, the chip support comprising a chip receiving zone;
the chip support including at least one front facing electrical terminal in the chip receiving zone, for coupling to a rear facing terminal of an ion-trap chip;
and at least one front facing wire bonding terminal electrically coupled to the at least one front facing electrical terminal, the at least one front facing wire bonding terminal being disposed outside of the chip receiving zone; and
whereby a chip can be fitted to the ion-trap chip carrier in the chip receiving zone with a rear facing electrical terminal in alignment with the at least one front facing electrical terminal in the chip receiving zone and electrically connected through the at least one front facing wire bonding terminal, to be wire bonded from a front face of the ion-trap chip carrier.

2. The ion-trap chip carrier according to claim 1, wherein the chip support comprises a first generally planar flange opposing a second generally planar flange, wherein the first generally planar flange faces the second generally planar flange between the at least one aperture.

3. The ion-trap chip carrier according to claim 2, wherein the chip support comprises a third generally planar flange disposed between the first generally planar flange and the second generally planar flange.

4. The ion-trap chip carrier according to claim 1, wherein the at least one aperture is or comprises an aperture at a centre-point of the ion-trap chip carrier.

5. The ion-trap chip carrier according to claim 1, wherein the chip receiving zone is recessed relative to a front surface of the ion-trap chip carrier, and wherein the chip support has a lower surface formed of the at least one generally planar flange that is generally in a same plane as the rear surface of the generally planar carrier substrate.

6. The ion-trap chip carrier according to claim 1, wherein the at least one of the generally planar flange comprises an array of electrical terminals connected to respective wire bonding terminals through embedded vias in the ion-trap chip carrier.

7. The ion-trap chip carrier according to claim 1, wherein the chip support includes a generally planar flange with at least one wire bond terminal extending along a front surface of the at least one generally planar flange into the chip receiving zone.

8. The ion-trap chip carrier according to claim 1, wherein the ion-trap chip carrier is formed of a non-magnetic material.

9. The ion-trap chip carrier according to claim 1, including an electrically conductive bump pad associated with the at least one front facing electrical terminal.

10. The ion-trap chip carrier according to claim 9, wherein the electrically conductive bump pad is compressible between a chip and the chip support to form a mechanical bond between the chip and chip support.

11. The ion-trap chip carrier according to claim 9, wherein the electrically conductive bump pad attaches a chip directly to the ion-trap chip carrier.

12. An assembly of an ion-trap chip and an ion-trap chip carrier, the assembly comprising:
a generally planar carrier substrate, wherein the generally planar carrier substrate includes a front surface, a rear surface, and a chip receptacle;
a chip support disposed in the chip receptacle of the generally planar carrier substrate, the chip support including at least one generally planar flange extending in or generally parallel to a plane of the generally planar carrier substrate, and at least one aperture therein, the chip support comprising a chip receiving zone;
the chip support including at least one front facing electrical terminal in the chip receiving zone, for coupling to a rear facing terminal of an ion-trap chip; and
at least one front facing wire bonding terminal electrically coupled to the at least one front facing electrical terminal, the at least one front facing wire bonding terminal being disposed outside of the chip receiving zone;
whereby a chip can be fitted to the ion-trap chip carrier in the chip receiving zone with a rear facing electrical terminal in alignment with the at least one front facing electrical terminal in the chip receiving zone and electrically connected through the at least one front facing wire bonding terminal, to be wire bonded from a front face of the ion-trap chip carrier; and
wherein the ion-trap chip carrier is disposed in the chip receiving zone of the chip support in the chip receptacle of the ion-trap chip carrier, over the at least one generally planar flange;
the chip including:
at least one rear facing terminal aligned with the at least one front facing electrical terminal of the ion-trap chip carrier and electrically connected through the at least one front facing wire bonding terminal; and
wherein the at least one rear facing terminal is wire bonded at the front face of the ion-trap chip carrier to an output terminal of the ion-trap chip carrier.

13. The assembly of claim 12, wherein the ion-trap chip carrier comprises first generally planar flange facing a second generally planar flange on which the ion-trap chip is supported.

14. The assembly of claim 13, wherein the first generally planar flange and the second generally planar flange includes respective arrays of front facing terminals and the chip includes first and second rear facing terminals substantially aligned with the respective arrays of front facing terminals.

15. The assembly of claim 13, wherein the ion-trap chip carrier comprises a third generally planar flange disposed between the first generally planar flange and the second generally planar flange and on which the ion-trap chip is supported, wherein the third generally planar flange comprises an array of wire bonding terminals each comprising a first end extending underneath the chip and a second end extending outside the chip support and disposed at or on the front face of the carrier.

16. The assembly of claim 12, wherein the chip is attached to the ion-trap chip carrier by means of a plurality of bump pads, each bump pad being disposed between a rear facing terminal of the chip and a front facing terminal of an associated flange.

17. A method of making an ion-trap assembly, the ion-trap assembly comprising an ion-trap chip carrier comprising:

a generally planar carrier substrate, wherein the generally planar carrier substrate includes a front surface, a rear surface, and a chip receptacle;

a chip support disposed in the chip receptacle of the generally planar carrier substrate, the chip support including at least one generally planar flange extending in or generally parallel to a plane of the generally planar carrier substrate, and at least one aperture therein, the chip support comprising a chip receiving zone;

the chip support including at least one front facing electrical terminal in the chip receiving zone, for coupling to a rear facing terminal of an ion-trap chip;

and at least one front facing wire bonding terminal electrically coupled to the at least one front facing electrical terminal, the at least one front facing wire bonding terminal being disposed outside of the chip receiving zone;

whereby ion-trap chip can be fitted to the ion-trap chip carrier in the chip receiving zone with a rear facing electrical terminal in alignment with the least one front facing electrical terminal in the chip receiving zone and electrically connected through the at least one front facing wire bonding terminal, to be wire bonded from the front face of the ion-trap chip carrier; and wherein the ion-trap chip is disposed in the chip receiving zone of the chip support in the chip receptacle of the ion-trap chip carrier, over the at least one generally planar flange; the chip including:

at least one rear facing terminal aligned with the at least one front facing electrical terminal of the ion-trap chip carrier and electrically connected through the at least one front facing wire bonding terminal;

the at least one rear facing chip terminal being wire bonded at the front face of the ion-trap chip carrier to a chip carrier output terminal;

the method including the steps of:

disposing on the at least one generally planar flange a plurality of bump pads in the chip receiving zone;

locating the ion-trap chip on the ion-trap chip carrier in the chip receiving zone; and compressing the ion-trap chip onto the ion-trap chip carrier so as to compress the plurality of bump pads to create a mechanical and electrical bond between the chip and the ion-trap chip carrier.

18. The method of claim 17, wherein the plurality of bump pads are compressed under pressure of around 100 g per bump pad and heat, by around 50% of their height.

* * * * *